United States Patent [19]

Chang

[11] Patent Number: 5,031,073
[45] Date of Patent: Jul. 9, 1991

[54] FAULT-ISOLATING APPARATUS AND METHOD FOR CONNECTING CIRCUITRY

[75] Inventor: Cheng-Cheng Chang, Palo Alto, Calif.

[73] Assignee: Hewlett-Packard Company, Palo Alto, Calif.

[21] Appl. No.: 518,389

[22] Filed: May 2, 1990

[51] Int. Cl.5 ............................ H05K 1/18; H05K 3/30
[52] U.S. Cl. ........................................ 361/410; 29/832;
174/260; 361/400; 361/413; 439/43; 439/45; 439/54
[58] Field of Search .......................... 29/832, 846, 847;
361/416, 409, 403, 404, 400, 410, 413; 439/43, 44, 45, 54, 68; 174/260

[56] References Cited

U.S. PATENT DOCUMENTS

| | | |
|---|---|---|
| 3,568,129 | 3/1971 | Gold et al. ........................ 361/403 X |
| 3,628,095 | 12/1971 | Schwartz et al. ................. 439/68 X |
| 3,739,231 | 6/1973 | Luteran ............................ 361/409 X |
| 3,755,888 | 9/1973 | Geil ................................. 361/409 X |
| 3,917,984 | 11/1975 | Kong et al. . | 
| 4,494,066 | 1/1985 | Goel et al. . |
| 4,674,007 | 6/1987 | Tragen ............................. 29/832 X |
| 4,866,508 | 9/1989 | Eichelberger et al. ........... 29/832 X |

Primary Examiner—Carl J. Arbes

[57] ABSTRACT

A method and apparatus for electrically connecting circuitry on a printed circuit board having a plurality of circuit regions, with each circuit region having components operatively associated with input and output signal lines that are electrically isolated from the signal lines of adjacent circuit regions. The input and output signal lines of a particular circuit region are arranged in a closely spaced pattern aligned with a corresponding pattern of traces on an adjacent circuit region. A plurality of connector members are selectively attached to the printed circuit board to provide signal communication among the regions. Each connector member has closely spaced conductive bars which are exposed to contact the signal lines. The conductive bars have a length and a pitch such that the bars place parallel trace patterns in electrical communication when pressed in place. The connector members are multi-layered members having the conductive bars attached to a dielectric substrate and having an elastomeric material captured between a dielectric substrate and a metallic cap.

20 Claims, 3 Drawing Sheets

FAULT-ISOLATING APPARATUS AND METHOD FOR CONNECTING CIRCUITRY

DESCRIPTION

1. Technical Field

The present invention relates generally to printed circuit boards and more particularly to circuit board connections.

2. Background Art

The increasing complexity and density of circuitry on a printed circuit board increases the difficulty of diagnosing, servicing and repairing improperly functioning printed circuit boards. The sometimes subtle interaction of integrated circuit chips to accomplish a circuit function can make pinpointing a defective component an arduous task. Even with stringent quality control measures, circuit components have a certain probability of failure, so in any printed circuit board failure of one or more of the components should be an expected event.

Various methods of error detection of a circuit or a system are known. In general, for computer systems there are at least two strategies for automatic error detection. One approach is to use software checks. An example would be to use two completely independent and different computational methods on the same inputs and compare the two solutions as a check of fault-free operation. The second approach is to use hardware checks which lend themselves more naturally to the assurance that proper operation of the system has occurred. While software checks usually require a redundancy in computations, hardware checks require redundant circuitry. Duplication of hardware may be used to provide parallel implementation of some or all of the logic functions of a system, whereafter the outputs of the implementations can be compared. These approaches, however, do not pinpoint a defective component.

U.S. Pat. No. 4,494,066 to Goel et al. teaches a method of electrically testing a packaging structure having a plurality of interconnected integrated circuit chips. The method provides a structure which permits chip-in-place testing so that each chip can be isolated for testing purposes through the pins, or other contacts, of a higher level package containing the chips. The method of Goel et al. requires use of "level sensitive scan design" rules for each chip, as well as the total package.

It is an object of the present invention to provide a fault-isolation apparatus and method which is easily and inexpensively implemented and which can be utilized to electrically substitute redundant circuits on a printed circuit board.

SUMMARY OF THE INVENTION

The above object has been met by a logical partitioning of a printed circuit board into a plurality of circuit regions which are selectively isolated with respect to input and output signals. The signal lines of a particular circuit region are arranged in an array of closely spaced traces which are aligned with, but spaced apart from, a corresponding array of an adjacent circuit region. Electrical communication between the adjacent circuit regions is provided by surface links of a connector member which is selectively attached directly to the printed circuit board.

The connector member includes a plurality of closely spaced conductive bars on the lower surface of a substrate. The conductive bars are exposed to contact the surface of the printed circuit board and have a pitch corresponding to the pitch of the signal line traces of the circuit regions. An elastomeric material is attached to the substrate on a side opposite to the conductive bars. The elastomeric material is captured between the substrate and a metallic cap. Bores through each of the substrate, the elastomeric material, and cap permit passage of externally threaded screws which may be threaded into the printed circuit board to mount the connector member to the board. Mounting of the connector member places first ends of the conductive bars in physical contact with the signal line traces of a first circuit region and places the opposed ends of the conductive bars in physical contact with signal line traces of a second circuit region. The physical contact with the conductive bars of the connector member permits electrical communication between the signal line traces of the first and second circuit regions.

The method for isolating improperly functioning or nonfunctioning components on the printed circuit board includes designing and manufacturing the printed circuit board to include the plurality of circuit regions and the patterns of signal line traces in each circuit region. The electronic components of the printed circuit board are then mounted to the board. Each component is operatively associated with the signal line traces of the circuit region in which the component resides but is signalisolated from components residing in other circuit regions. Components of adjacent circuit regions can be electrically coupled by attachment of a connector member having the array of shorting bars.

An advantage of the present invention is that the surface links permit isolation of any single circuit region from the remainder of the circuitry of the printed circuit board. If desired, a combination of regions may be signal-isolated. Mounting of a connector member functions in the manner of a switch to activate one or more circuit regions. Selective isolation facilitates localization of a defective component. For example, in a printed circuit board which does not meet prescribed specifications, serial removal of connector members may be used as a technique for discovering the substandard component.

Another advantage is that the board may be designed to include redundant circuitry in separate circuit regions so that a redundant circuit can act as a spare circuit. Another advantage is that the exposed signal line traces provide convenient testing points for troubleshooting and testing of the circuitry.

The connector members are physically small so as not to occupy much of the circuit board real estate. The construction of the connector members is adapted to a standard and universal design and does not add appreciably to the cost of the board.

BRIEF DESCRIPTION OF THE DRAWINGS

FIG. 3a is a side sectional view of the connector member of FIG. 3, taken along lines 3a—3a.

BEST MODE FOR CARRYING OUT THE INVENTION

Figure 1:
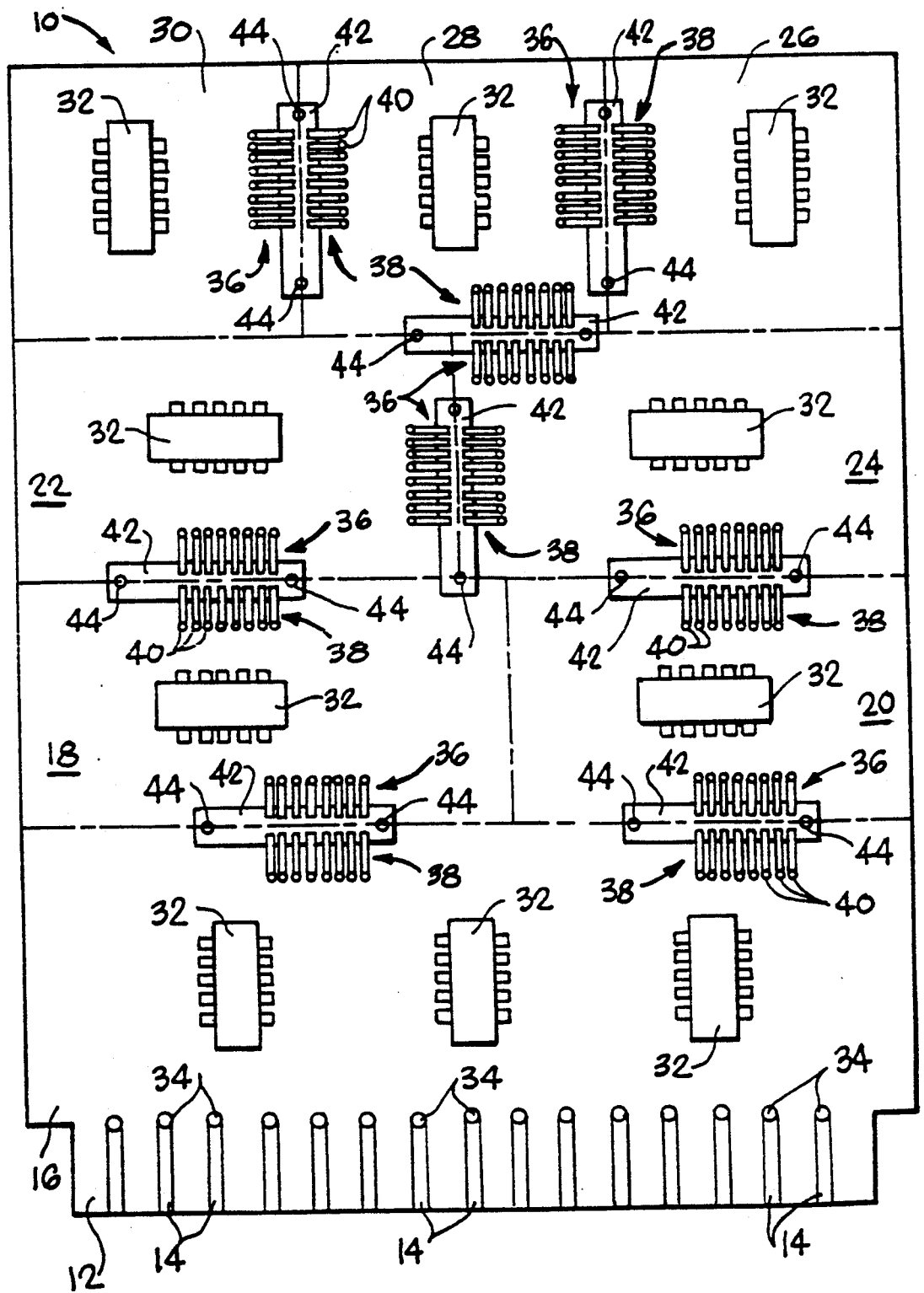
FIG. 1 is a top view of a printed circuit board having signal line traces operatively associated with isolated circuit regions in accord with the present invention.

With reference to FIG. 1, a printed circuit board 10 is shown as having a conventional edge connector 12 at one end for receiving utilities and for inputting and outputting signals utilized in operation of the circuitry of the board. The edge connection places circuit board traces 14 in physical contact with a receiving unit, not shown.

The real estate of the printed circuit board 10 is partitioned into eight circuit regions 16, 18, 20, 22, 24, 26, 28 and 30. While only the largest of the circuit regions 16 is shown as having more than one integrated circuit 32, in practice the circuit board 10 includes a number of integrated circuit chips 32 in each region 16–30, as well as other electronic components.

The circuit regions 16–30 are illustrated as being divided by dashed lines since the regions are not physically separated. The regions are separated only with respect to signal isolation. Typically, the circuit regions share utilities, such as electrical ground and 5V dc for operation of the integrated circuit chips 32. The interconnection of utilities may be on the side of the circuit board opposite the integrated circuit chips. Utilities enter by means of the traces 14 of the edge connection 12 and pass to the reverse side of the board by means of plated vias 34. Alternatively, the circuit regions 16–30 may be isolated with respect to utility voltages as well as signal voltages so that any electrical communication among circuit regions requires connector members described below.

The partitioning of the circuit board real estate is preferably a logical partitioning. For example, circuit region 18 may contain all of the input devices of the circuit board 10, while circuit region 20 contains the output devices and region 18 functions as a memory unit. The board 10 may include redundant circuitry. For instance, the circuit regions 26 and 30 may be duplicative, allowing a user to disconnect one of the two regions and connect the other region to the remainder of the board if the circuitry of the first region were to malfunction.

Each circuit region 16–30 includes at least one array 36 and 38 of closely spaced signal line traces. Each trace in the array 36 of a region comprises conductive materials suited for electrical communication with like materials well brought into pressure contact. A preferred structure is a gold coating over a nickel layer which is atop a copper underlayer. First ends of the traces of one array 36 are closely spaced from first ends of the array 38 of an adjacent region. Because the aligned arrays 36 and 38 are in spaced relation to each other, signal communication between the adjacent regions does not occur. The second ends of the traces of each array 36 and 38 connect to plated vias 40 through to voltages and signals to and from the bottom surface or internal layers of the printed circuit board 10.

Associated with each alignment of a pair of the arrays 36 and 38 is a mounting plate 42. While the plates 42 are shown as being on the upper surface of the printed circuit board 10, preferably, the plates are fixed to the lower surface. Embedding the mounting plates 42 into the upper surface of the printed circuit board is possible, but bottom mounted plates promote the ease-of-manufacture aspect of the present invention.

The opposed ends of each mounting plate 42 include internally threaded bores 44 to receive a fastening screw. Optionally, the printed circuit board 10 may be machined to include internally threaded bores and the mounting plates 42 may be eliminated. The mounting plates, however, are made of a more mechanically reliable material than standard printed circuit boards, and are therefore preferred.

Figure 2:
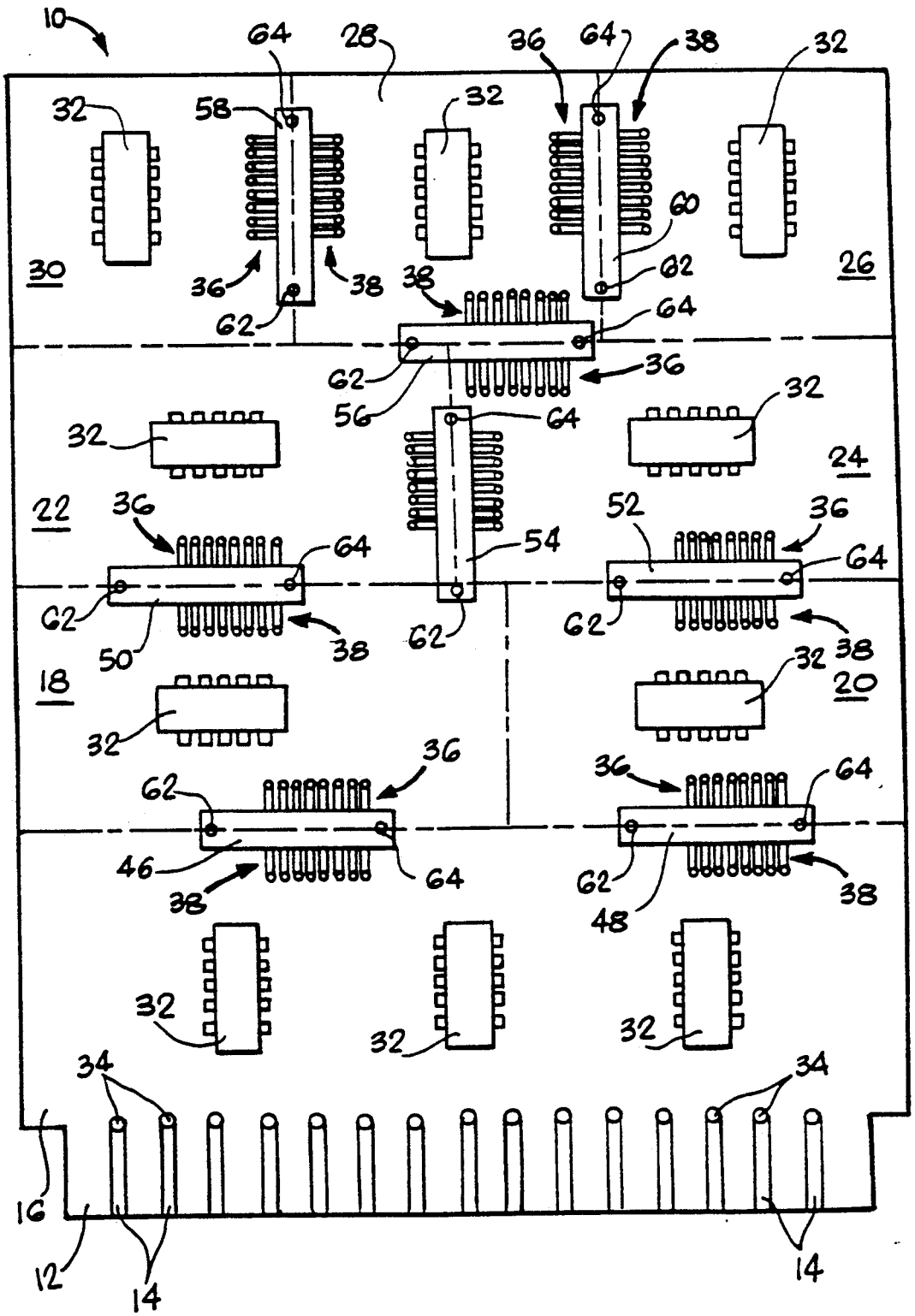
FIG. 2 is a top view of the printed circuit board of FIG. 1 having connector members for electrical communication between signal line traces of adjacent circuit regions.
Figure 3:
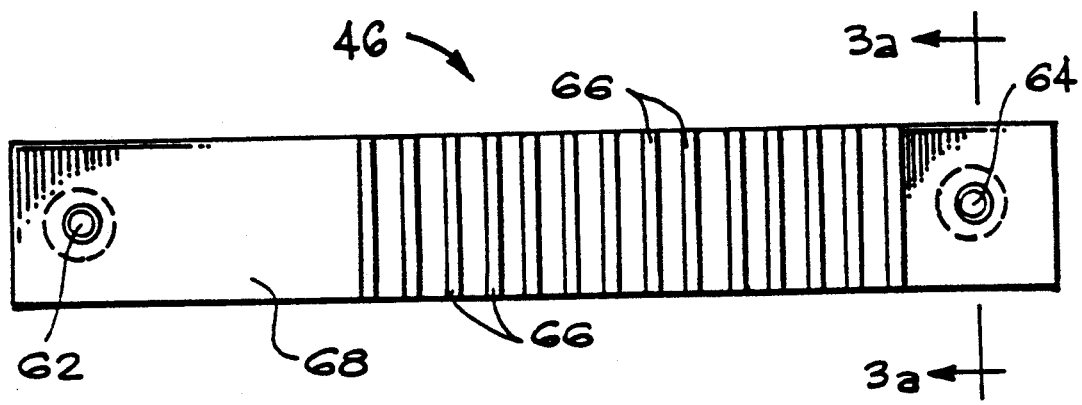
FIG. 3 is a bottom view of a connector member of FIG. 2.
Figure 3A:
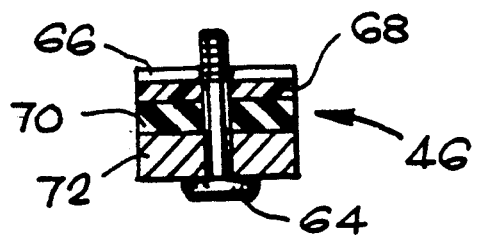
Figure 4:
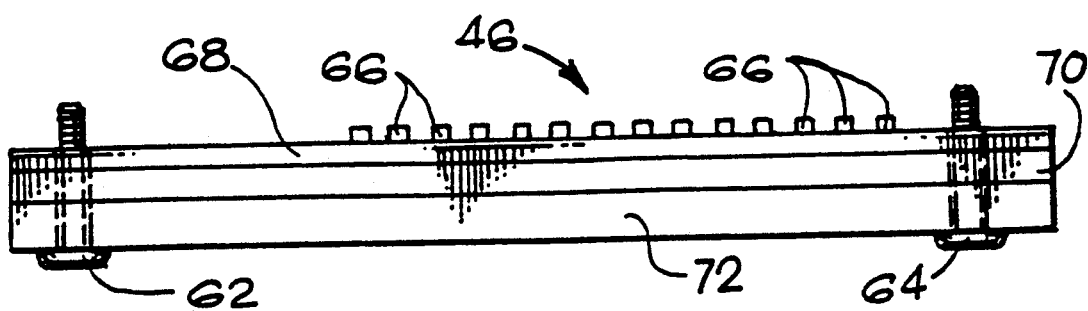
FIG. 4 is a front view of the connector member of FIG. 3.

Referring now to FIGS. 2-4, connector members 46, 48, 50, 52, 54, 56, 58 and 60 connect to the above-described mounting plates by shoulder screws 62 and 64. The bottom surface of the connector member includes an array of conductive bars 66. The arrangement of the conductive bars 66 corresponds to the arrays 36 and 38 of signal line traces on the printed circuit board 10. Thus, tightening of the shoulder screws 62 and 64 causes pressure contact of the conductive bars to the signal line traces. While the conductive bars are shown as extending below the surface of the connector member 46, the conductive bars may be embedded in the connector member.

The conductive bars 66 of the connector members 46–60 are preferably made of the same materials as the signal line trace described above. The conductive bars 66 are attached to a layer 68 of dielectric material, such as polyimide. On a side of the dielectric material 68 opposite to the conductive bars 66 is a layer 70 of elastomer material. The material 70 acts to properly distribute the compression forces applied to the connector members 46–60 by tightening of the shoulder screws 62 and 64. Viton is a preferred material. The cap layer 72 of the connector members is metallic. The heads of the shoulder screws 62 and 64 rest against the metallic cap layer.

Referring now to FIGS. 1 and 3, the dimensions of the conductive bars 66 of the connector member 46 are such that no precision alignment of the connector member to the mounting plate is necessary. The conductive bars are sufficiently long to easily overlap the signal line traces of the arrays 36 and 38 of the circuit board traces. Moreover, the conductive bars should have a width which is greater than the width of the signal line traces. The pitch of the conductive bars should be at least 25 mils. A density of 20 conductive bars per inch is easily accommodated.

Fastening of each of the connector members 46–60 to the printed circuit board 10, as shown in FIG. 2, causes a pressure contact of the conductive members of the connector members to the traces of both arrays 36 and 38 of signal line traces. The printed circuit board then functions as a single unit for accomplishing the task for which the board was designed. If the board functions improperly removal of the connector members 46–60 permits isolation of the circuit regions 16–30. The isolation of regions facilitates troubleshooting of the printed circuit board. Removal of a connector member prevents electrical communication between adjacent circuit regions and bares the traces of the arrays 36 and 38 so that the individual traces can be used as testing points. Troubleshooting for a defective component can quickly be reduced to a testing of components in a single circuit region.

While the present invention has been illustrated and described as having each of the connector members 46–60 on a single side of a printed circuit board, this is not critical. Optionally, some or all of the connector members may be located on the rear surface of the printed circuit board. Moreover, while the connector members have been illustrated as having a correct and an incorrect orientation, preferably the conductive bars and the arrays 36 and 38 of circuit board traces are centered so that the connector members may be reversed and still provide the same pressure contact.

I claim:

1. An apparatus for connecting electrical circuitry comprising,
   a circuit board having a major surface with first and second signal-isolated regions, said first signal-isolated region having a first array of conductive surface contacts and said second signal-isolated region having a second array of conductive surface contacts spaced apart from said first array, and
   a connector member selectively coupled to said circuit board surface, said connector member having a fixed connecting array of closely spaced contacts disposed such that a plurality of surface contacts of said first array are in electrical communication with a plurality of surface contacts of said second array by mutual contact with said connecting array when said connector member is coupled to said circuit board surface.

2. The apparatus of claim 1 wherein said connector member includes a substrate and means for selectively mounting said substrate to said circuit board surface, said connecting array of contacts being conductive traces fixed to a surface of said substrate.

3. The apparatus of claim 1 wherein said first and second arrays of surface contacts are arrays of circuit board traces and wherein said connecting array is an array of parallel bars, each bar having a first end in physical contact with a circuit board trace of said first array and having a second end inn physical contact with a circuit board trace of said second array when said connector member is coupled to said circuit board.

4. The apparatus of claim 2 wherein said connector member includes ann elastomeric material captured between said substrate and a cap, said elastomeric material being attached to said substrate on a side opposite to said connecting array of contacts.

5. The apparatus of claim 1 wherein said connector member is selectively coupled to said circuit board surface by fastening screws.

6. The apparatus of claim 1 wherein said first and second arrays are each an array of closely spaced traces having an alignment corresponding to the alignment of the other of said arrays.

7. An apparatus for electrically connecting circuitry on a printed circuit board comprising,
   a printed circuit board having a plurality of regions on a major surface thereof, each region having circuitry operatively associated with input and output signal lines, said signal lines being closely spaced conductors on said region in electrical isolation with the signal lines of ann adjacent region,
   a connector member having closely spaced parallel conductive bars, said conductive bars being exposed to contact said major surface of said printed circuit board and having a length and pitch such that said conductive bars are in physical contact with and provide electrical communication between signal lines of adjacent regions when said connector member is mounted to said major surface, and
   means for releasably mounting said connector member to said major surface of said printed circuit board.

8. The apparatus of claim 7 wherein said mounting means is a screw fastening means.

9. The apparatus of claim 7 wherein said conductive bars are gold-coated nickel on an underlayer of copper.

10. The apparatus of claim 7 wherein said connector member is a first connector member, said apparatus further comprising a second connector member releasably mounted to said printed circuit board, said second connector member having conductive bars having opposed ends in physical contact with signal lines of adjacent circuit regions other than those signal lines contacted by said first connector member.

11. The apparatus of claim 7 wherein said signal lines are circuit board traces.

12. The apparatus of claim 11 wherein said traces are gold-coated nickel on a layer of copper.

13. The apparatus of claim 7 wherein said dielectric material is polyimide.

14. The apparatus of claim 7 wherein two of said regions have functionally identical circuitry.

15. An apparatus for electrically connecting circuitry on a printed circuit board comprising,
   a printed circuit board having a plurality of regions on a major surface thereof, each region having circuitry operatively associated with input and output signal lines, said signal lines being closely spaced conductors on said region in electrical isolation with the signal lines of an adjacent region,
   a connector member having closely spaced conductive bars, said conductive bars being exposed to contact said major surface of said printed circuit board and having a length and pitch such that said conductive bars are in physical contact with and provide electrical communication between signal lines of adjacent regions when said connector member is mounted to said major surface, said conductive bars fixed to a substrate of dielectric material, said connector member having a cap coupled to said substrate on a side opposite to said conductive bars, and
   means for releasably mounting said connector member to said major surface of said printed circuit board.

16. The apparatus of claim 15 wherein said connector member includes an elastomer between said dielectric material and said cap.

17. A method for isolating potential faults comprising,
   producing a printed circuit board having first and second circuit regions and patterns of signal lines in each of said circuit regions, said signal lines of said first circuit region being spaced apart from said signal lines of said second circuit region,
   mounting electronic components in said circuit regions, each component being operatively associated with said signal lines of the circuit region in which the component resides and being signal-isolated from components residing in the other circuit region, and
   selectively coupling a connector member having an array of connecting contacts to sad printed circuit board in a position such that a plurality of said connecting contacts each physically contact said signal lines of both of said first and said second circuit regions, thereby providing signal communication between said circuit regions.

18. The method of claim 17 wherein said coupling of said connector member to said printed circuit board includes a screw fastening.

19. The method of claim 19 wherein said producing of said printed circuit board includes designing said printed circuit board to include a third circuit region having a pattern of signal lines adjacent to but spaced apart from a corresponding pattern of said second circuit region, said method further comprising selectively coupling a connector member to said printed circuit board to provide signal communication between said second and third circuit regions.

20. The method of claim 19 wherein said mounting of said electronic components includes providing redundant circuits in said first and third circuit regions.

* * * * *